United States Patent [19]
Lee

[11] Patent Number: 5,950,102
[45] Date of Patent: Sep. 7, 1999

[54] METHOD FOR FABRICATING AIR-INSULATED MULTILEVEL METAL INTERCONNECTIONS FOR INTEGRATED CIRCUITS

[75] Inventor: William W. Y. Lee, Palo Alto, Calif.

[73] Assignee: Industrial Technology Research Institute, Hsinchu, Taiwan

[21] Appl. No.: 08/794,601

[22] Filed: Feb. 3, 1997

[51] Int. Cl.$^6$ .................................................. H01L 21/44
[52] U.S. Cl. ...................... 438/619; 438/618; 438/622; 257/522; 257/758
[58] Field of Search ................................. 438/619, 618, 438/622; 257/522, 758

[56] References Cited

U.S. PATENT DOCUMENTS

| | | | |
|---|---|---|---|
| 4,857,481 | 8/1989 | Tam et al. | 438/619 |
| 4,925,805 | 5/1990 | van Ommen et al. | 437/21 |
| 5,171,713 | 12/1992 | Matthews | 438/31 |
| 5,306,659 | 4/1994 | Beyer et al. | 437/64 |
| 5,413,962 | 5/1995 | Lur et al. | 438/619 |
| 5,447,599 | 9/1995 | Li et al. | 216/17 |

*Primary Examiner*—Peter Toby Brown
*Assistant Examiner*—Edwin Oh
*Attorney, Agent, or Firm*—George O. Saile; Stephen B. Ackerman

[57] ABSTRACT

A method for making air-insulated planar metal interconnections having low interlevel capacitance with improved RC time delays for integrated circuits is achieved. The method involves using a multilayer of negative and positive photoresists in which open regions are developed in the negative photoresist for the metal interconnections, and open regions are developed in the positive photoresist for via holes. The open regions are then filled with a Ti/TiN diffusion barrier deposited at room temperature and an electroless plated copper, and polished back using a Dual Damazene to form the interconnecting metal level and the via hole stud. The method is repeated several times to form multilevel metal interconnections. The remaining photoresist is then totally removed by oxygen ashing to leave a free-standing multilevel metal interconnection structure that is conformally coated with a thin $Al_2O_3$ passivation layer and having air insulation. This results in a much lower inter- and intralevel capacitance and improved circuit performance.

30 Claims, 4 Drawing Sheets

METHOD FOR FABRICATING AIR-INSULATED MULTILEVEL METAL INTERCONNECTIONS FOR INTEGRATED CIRCUITS

BACKGROUND OF THE INVENTION (1) Field of the Invention

The present invention relates to a method for making integrated circuits on semiconductor substrates, and more particularly relates to a method for forming air-insulated multilevel wiring for interconnecting the discrete devices on integrated circuits.

(2) Description of the Prior Art

Integrated circuits fabricated on semiconductor substrates for Ultra-Large Scale Integration (ULSI) require multilevels of metal interconnections for electrically interconnecting the discrete semiconductor devices on the semiconductor chips. In the more conventional method the different levels of interconnections are separated by layers of insulating material. These interposed insulating layers have etched via holes which are used to connect one level of metal to the next. Typically, the insulating layer is a silicon oxide ($SiO_2$) having a dielectric constant (relative to vacuum) of about 3.5 to 4.0. However, as the device dimensions decrease and the packing density increases, it is necessary to reduce the spacing between the metal lines in the interconnections to effectively wire-up the integrated circuits. Unfortunately, as the spacing decreases, the intra- and interlevel capacitances increase between metal lines when an insulating layer having the same dielectric constant is used since the capacitance is inversely proportional to the spacing between the lines. This, in turn, adversely affects the signal propagation time in the circuit since the response of the circuit is dependent on the RC delay time, where R is the resistance of the metal line, and C is the inter- and intralevel capacitance mentioned above.

One approach to minimize these time delays is to use an insulating material which has a lower dielectric coefficient, such as a polyimide. For example, polyimides can be used which have dielectric constant as low as 3.2 to 3.4.

Another method used to reduce the capacitance between the integrated circuit devices on silicon substrates and the substrate has been claimed by K. Beyer et al. in U.S. Pat. No. 5,306,659. In this method an $N_+$ heavily doped buried epitaxy layer in the silicon substrate is selectively laterally etched underneath a lightly doped N_region which is then used as the device area. This reduces the capacitance between the semiconductor devices, such as field effect transistors (FETs) and bipolar transistors and the underlying semiconductor substrate.

There is still a need in the semiconductor industry for providing a simplified method for forming multilevel metal interconnections having reduced inter- and intralevel capacitance for reduced RC time delays and improved circuit performance.

SUMMARY OF THE INVENTION

A principal object of the present invention is to provide air-insulated multilevel interconnections for integrated circuits thereby providing lowest possible interlevel and intralevel capacitances between adjacent metal lines.

It is another object of this invention to fabricate these air-insulated metal interconnections by a Dual Damazene process using patterned layers of positive and negative photoresists.

A further object of this invention is to provide a very low resistance interlevel metallurgy using electroless plated copper, thereby providing improved RC time constants for the integrated circuits.

The method of this invention provides for the fabrication of air-insulated metal interconnections for integrated circuits for ultra-large scale integration (ULSI). As the circuit density increases, the RC delay associated with the interconnected lines on the integrated circuits limits the propagation delay for these ULSI circuits.

The invention for making these air-insulated interconnections begins by providing a substrate having device areas that are surrounded and electrically insulated from each other by field oxide regions. A patterned first polysilicon layer is used to make portions of the devices in the device areas, and can also serve to form local interconnections elsewhere on the substrate. A first insulating layer is deposited on the substrate and is planarized. This layer electrically insulates the devices. The first insulating layer forms an interlevel dielectric (ILD) and is preferably composed of borophosphosilicate glass (BPSG). A second insulating layer, preferably silicon nitride ($Si_3N_4$), is deposited on the ILD layer which seals the device structures from the ambient environment. Contact openings are then etched in the first and second insulating layers using conventional photolithographic techniques and anisotropic plasma etching. The contact openings are typically etched to the patterned first polysilicon layer and to device areas where contacts to the underlying devices are desired. A first conducting layer is selectively deposited or blanket deposited, and etched or polished back to form metal plugs in the contact openings. Preferably the first conducting metal layer is composed of tungsten (W).

Now more specifically relating to the method of this invention, a first negative photoresist layer is formed by spin coating and is soft-baked. The first negative photoresist layer is then patterned by exposing and developing and is then hard-baked to form open regions extending over the metal plugs. This forms the open areas where the first metal interconnections are required. A second conducting layer is deposited conformally at room temperature, for example by ionized or long-throw sputter deposition. The second conducting layer is composed of two layers, and is preferably a titanium (Ti) layer on which is deposited or formed a titanium nitride (TiN) layer. The Ti and TiN layers serve as a diffusion barrier, and also improve bonding strength between metal layers. The first metal interconnections are now completed by depositing a third conducting layer. Preferably the third conducting layer is copper (Cu) and is deposited by electroless plating. The Cu layer is then chemical/mechanically polished back to and partially into the photoresist layer, thereby providing a first level of metal interconnections that are planar with the surface of the photoresist layer. A positive photoresist layer is now deposited over the metal interconnections and over the first negative photoresist layer, and a second negative photoresist layer is deposited on the positive photoresist layer. The second negative photoresist layer is then patterned leaving open regions over areas of the positive photoresist where second metal interconnections are desired. Since the negative and positive photoresists use different solvent systems, the second negative photoresist layer can be developed without affecting the underlying positive photoresist. The positive photoresist is then exposed and developed in portions of the open regions of the second negative photoresist layer, thereby forming via holes to the first level of metal interconnections. Similar to the formation of the first metal interconnections, the second metal interconnections are formed by depositing a conformal fourth conducting layer over the second negative photoresist layer and in the open regions in the second negative photoresist layer. The fourth conducting layer is also composed of two layers, preferably a Ti layer having deposited or formed on its surface a TiN layer. The Ti/TiN layers are deposited at room temperature using sputter deposition. A fifth conducting layer, preferably Cu, is plated using electroless deposition. Both the fourth and fifth conducting layers fill up the voids in the via holes in the positive photoresist layer and also the openings in the second negative photoresist layer. This Cu layer is then planarized using chemical/mechanical polishing to form the second level of metal inter-connections.

By repeating the process steps for patterning the second negative photoresist layer and for forming the via holes in the positive photoresist layer, and by repeating the metal depositions, a third level and subsequent levels of metal interconnections can be fabricated.

The photoresists throughout all the layers are now removed by plasma ashing in an oxygen ambient. A thin passivating layer, preferably aluminum oxide ($Al_2O_3$) is conformally deposited on the exposed surface of the first and subsequent levels of metal interconnections. This provides a passivated metal interconnection having a thin $Al_2O_3$ (about 500 Angstroms) and air dielectric between the metal lines. After completing the air-insulated integrated circuits (ICs), the ICs can be die bonded and wire bonded in a ceramic package and sealed in an inert atmosphere.

BRIEF DESCRIPTION OF THE DRAWINGS

The objects and other advantages of this invention are best understood with reference to the preferred embodiment when read in conjunction with the following drawings.

DESCRIPTION OF THE PREFERRED EMBODIMENTS

The present invention relates to a method for fabricating air-insulated metal interconnections on semiconductor substrates for ULSI circuits. The method utilizes negative and positive photoresist layers that can be patterned by exposure and development one over the other by using different solvent developing systems. Patterned openings are formed in the positive resist for forming via holes, and openings are formed in the negative resist in which planar metal inter-connecting lines are formed. The via holes and openings in the negative photoresist are then filled with a high conductivity metal deposited at room temperature, and polished back to form the planar inter-connecting structures. The photoresists are removed leaving a low dielectric constant air insulation between the metal lines.

Although the method is described for making the metal interconnections on a P-type substrate having N-channel field effect transistors (FETs), it should be well understood by one skilled in the art that the method equally applies to other types of devices such as P-channel FETs, and indeed can be also used on substrates having both P- and N-wells in which N- and P-channel FETs can be formed for CMOS circuits. Further, the method is described for two levels of interconnections, but it should also be well understood by one skilled in the art that the process can be repeated to make additional levels of interconnections.

Figure 1:
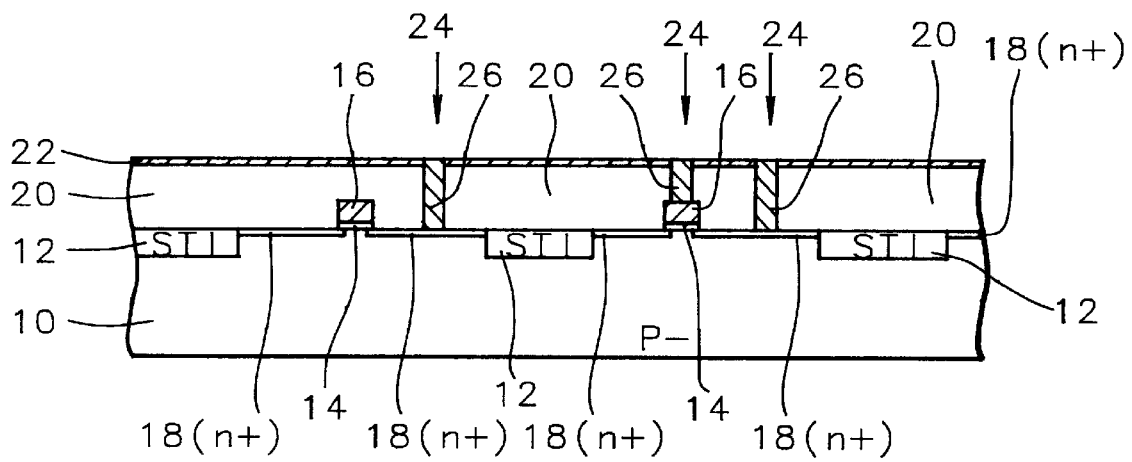
FIGS. 1 through 7 show schematic cross-sectional views for the sequence of process steps for making air-insulated metal interconnections on integrated circuits by the method of the present invention.

Referring now to FIG. 1, a cross-sectional view of a substrate 10 having a partially completed semiconductor structure is shown. The preferred substrate can be either a P-type or N-type single crystalline silicon having a <100> crystallographic orientation. To simplify the discussion, a P-type substrate for forming N-channel field effect transistors (FETs) is depicted in the FIG. A Field OXide (FOX) is formed in the substrate around the active device regions to isolate these individual device regions. The FOX can be formed, for example, as a shallow trench isolation (STI) 12 by recessing and then selectively thermally oxidizing, or by filling with a chemical vapor deposited (CVD) oxide to form a planar surface with the device areas. For example, one method of forming this STI can be by SideWAll-Mask Isolation (SWAMI) techniques.

For the purpose of forming N-channel FETs, a gate oxide 14 is thermally grown on the device areas, for example having a thickness of between about 90 and 200 Angstroms. A first polysilicon layer 16 is deposited and patterned to form the gate electrodes, also labeled 16, for the N-channel FETs. This patterned polysilicon layer also serves to form local interconnections elsewhere on the substrate. Preferably the polysilicon layer 16 is $N^+$ doped to a concentration range of between about 1.0 E 19 and 1.0 E 21 atoms/cm$^2$ and has a thickness of between about 2000 and 5000 Angstroms. Although lightly doped drain (LDD) FETs can be made, to simplify the drawings and discussion a simple FET without LDD is depicted in FIG. 1. The FET is then completed by forming the $N^+$ source/drain regions 18 adjacent to the gate electrodes 16. For example, the source/drain can be formed by implanting arsenic ($As^{75}$) at a dose of between about 2.0 E 15 and 1.0 E 16 atoms/cm$^2$ and at an ion energy of between about 20 and 70 KeV.

Still referring to FIG. 1, a first insulating layer 20 is deposited over the device areas and elsewhere over the shallow trench isolation (STI). This insulating layer 20 electrically insulates the semiconductor devices from the overlying metal interconnections and is planarized to support the multilevel interconnections having the air-insulation subsequently built on the substrate. This first insulating layer forms the interlevel dielectric (ILD) and is preferably composed of borophosphosilicate glass (BPSG). The BPSG is preferably deposited using a reactant gas such as silane and oxygen and appropriately doped with boron and phosphorus. Alternatively, the BPSG can be formed using tetraethosiloxane (TEOS) and appropriately doped with boron and phosphorus. Preferably the BPSG is planarized by using chemical/mechanical polishing (CMP), and after planarizing has a preferred thickness of between about 5000 and 15000 Angstroms over the patterned first polysilicon layer 16. A second insulating layer 22, preferably silicon nitride ($Si_3N_4$), is deposited on the planar first insulating layer (ILD) 20 which seals the device structures from the ambient environment. For example, the $Si_3N_4$ prevents ionic contamination, such as sodium, from degrading the device characteristics. The $Si_3N_4$ can be deposited by low pressure chemical vapor deposition (LPCVD) using a reactant gas mixture such as dichlorosilane ($SiCl_2H_2$) and ammonia ($NH_3$) at a temperature of between 700 and 800° C. Preferably the $Si_3N_4$ is deposited to a thickness of between about 500 and 2000 Angstroms.

Continuing with FIG. 1, contact openings 24 are then etched in the first and second insulating layers 20 and 22 using conventional photolithographic techniques and anisotropic plasma etching. The contact openings 24 are etched to the patterned first polysilicon layer 16 and to device areas such as the source/drain areas 18 where contacts to the underlying devices are desired. The etching can be carried out, for example, in a reactive ion etcher (RIE) using a fluorine-containing gas such as carbon tetrafluoride ($CF_4$). A first conducting layer 26 is deposited, and is etched or polished back to form the metal plugs 26 in the contact openings 24. Preferably the first conducting metal layer 26 is composed of a thin layer of titanium nitride (TiN) and tungsten (W) which is deposited by CVD using, for example, tungsten hexafluoride ($WF_6$) as the tungsten source gas. Preferably layer 26 is deposited to a thickness sufficient to fill the contact openings 24 and is preferably between about 7000 and 15000 Angstroms thick. Alternatively, the tungsten can be deposited by selectively depositing the tungsten in the contact openings.

Figure 2:
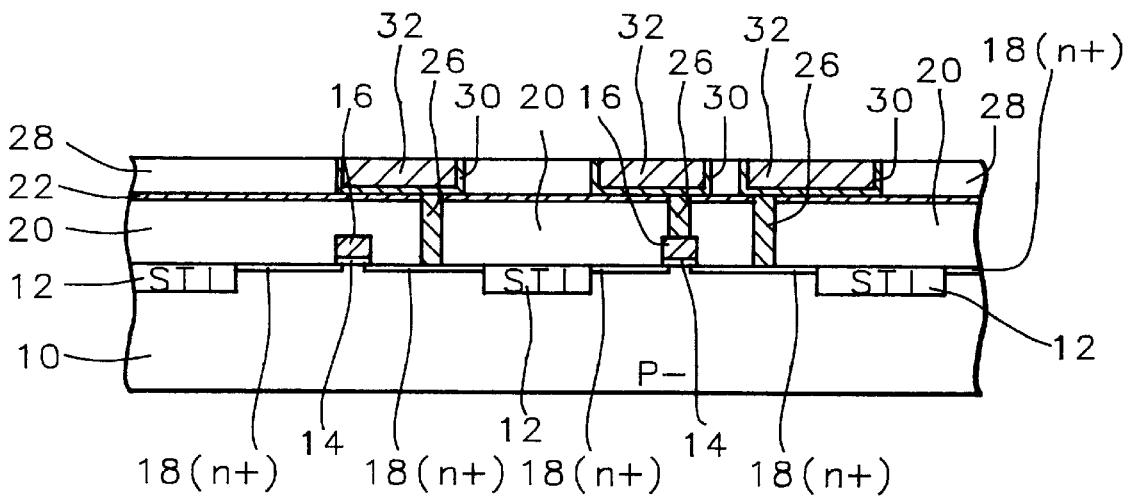

Referring to FIG. 2 and proceeding with the invention, a first negative photoresist layer 28 is formed by spin coating and is then soft-baked. For example, a negative resist such as type SNR-200, manufactured by Shipley Company of U.S.A. can be used, and is preferably deposited to a thickness of between about 8000 and 10000 Angstroms, and more specifically has a thickness of 9000 Angstroms. The soft-bake can be carried out in a temperature range of about 90 to 100° C. for about 25 to 35 minutes. First negative photoresist layer 28 is then patterned by exposing the photoresist to radiation leaving exposed portions, while developing out the unexposed photoresist thereby forming open regions in areas where the first metal level pattern is desired. The open regions also extend over the metal plugs 26 to provide contacts to the substrate and the first polysilicon layer 16. The photoresist is then hard-baked at a temperature of between about 120 and 140° C. for about 50 to 70 seconds. A second conducting layer 30 and a third conducting layer 32 are deposited conformally at room temperature, and are polished back to the first negative photoresist 28 to form the planar first level metal as shown in FIG. 2. Layer 30 is preferably deposited using collimated or long-throw sputtering which provides an essentially vertical deposition of layer 30 in the bottom of the open regions where the first metal pattern is desired. The second conducting layer 30 is composed of two layers, preferably a titanium (Ti) layer on which is formed a titanium nitride (TiN) layer. The Ti and TiN layers serve as a diffusion barrier, and also improve bonding strength between metal layers. The third conducting layer 32 is preferably composed of copper (Cu) and is deposited by electroless plating filling the open regions in the negative photoresist layer 28. For example, the substrate is immersed in an electrolytic solution containing copper ions at room temperature. The copper layer 32 and second conducting layer 30 are now polished back and partially into the first negative photoresist layer 28. Chemical/ mechanical polishing is used to form the planar structure and to complete the first level of metal interconnections, as shown FIG. 2.

Figure 3:
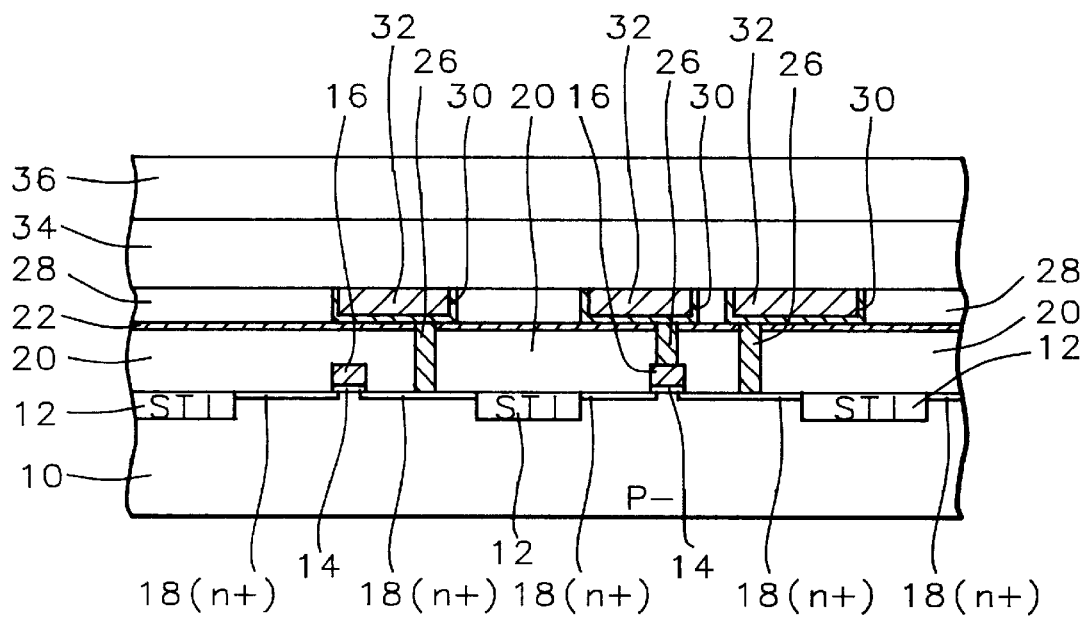

Referring now to FIG. 3, the method for forming the second level of metal interconnections is achieved as follows. A positive photoresist layer 34 is deposited over the metal interconnections made up of layers 30 and 32, and over the first negative photoresist layer 28. A second negative photoresist layer 36 is deposited on the positive photoresist layer 34. One preferred type of positive photoresist that can be used is type UV-II HS manufactured by Shipley Company of U.S.A. The preferred thickness of positive photoresist layer 34 is between about 6000 and 8000 Angstroms, and more specifically 7000 Angstroms. The positive photoresist is then soft-baked at a temperature between about 90 and 110° C. for about 80 to 100 seconds. The second negative photoresist 36 is then deposited on positive photoresist layer 34 by spin coating and is soft-backed similar to the first negative photoresist layer. The preferred thickness of layer 36 is between about 9000 and 11000 Angstroms, and more specifically 10000 Angstroms.

Figure 4:
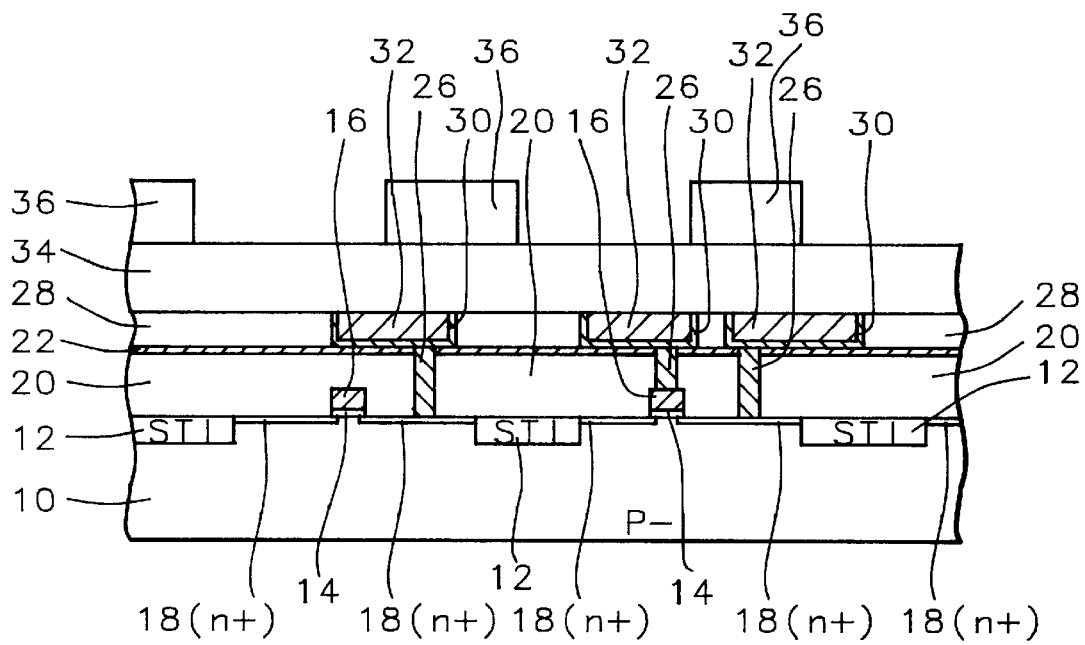

Referring to FIG. 4, the second negative photoresist layer 36 is patterned to form open regions over the positive photoresist where the second level of metal interconnections is desired. Since the negative and positive photoresists use different solvent systems, the second negative photoresist layer can be developed without affecting the underlying positive photoresist. For example, the preferred developer for the negative photoresist is type MF-CD-26 developer, and the positive photoresist can be developed in type TMAH developer also provided by Shipley Company.

Figure 5:
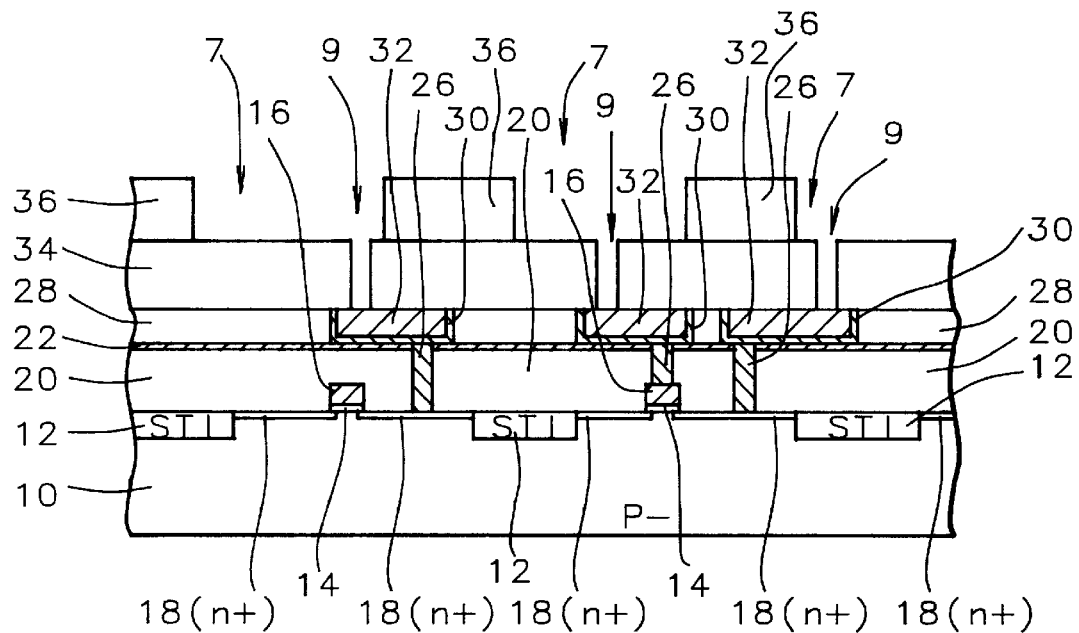

Referring now to FIG. 5, the positive photoresist layer 34 is then exposed and developed in portions of the open regions 7 of the second negative photoresist layer 36, thereby forming via holes 9 to the first level of metal interconnections formed from layers 30 and 32. Since the negative photoresist layer 36 is developed out in the unexposed regions, the underlying positive photoresist thereunder is also not exposed, and therefore also remains in the open regions 7 when a second mask is used to expose and develop out the via holes 9 in the underlying positive photoresist layer 34.

Figure 6:
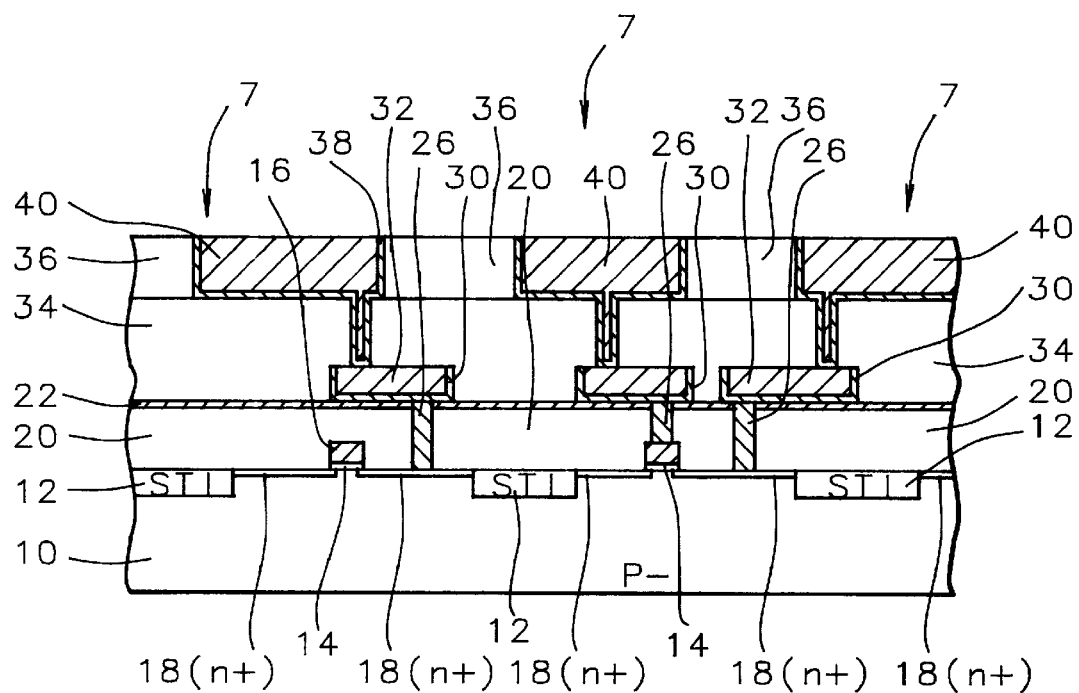

Referring to FIG. 6, similar to the formation of the first metal interconnections (layers 30, 32), the second metal interconnections are formed by depositing a conformal fourth conducting layer 38 and a fifth conducting layer 40 over the second negative photoresist layer 36 and in the open regions 7 and via holes 9, and polished back to form the second level of metal interconnections (layers 38 and 40). The fourth conducting layer 38 is also composed of two layers, preferably a Ti layer having deposited or formed on its surface a TiN layer. The Ti/TiN layers are deposited at room temperature using plasma or long-throw sputter deposition. A fifth conducting layer, preferably Cu, is plated using electroless deposition which fills up the voids in the via holes 9 and also the openings 7 in the second negative photoresist layer 36. And, similar to the process for planarizing the first level of metal interconnections, the Cu layer 40 and the barrier layer 38 are polished down and partially into the second negative photoresist layer 36 using chemical/mechanical polishing to form the second level of metal interconnections from layers 40 and 38.

By repeating the process steps for patterning the second negative photoresist layer and for forming the via holes in the positive photoresist layer, and by repeating the metal depositions, a third level and subsequent levels of metal interconnections can be fabricated, as is needed to complete the necessary wiring for the integrated circuits.

Figure 7:
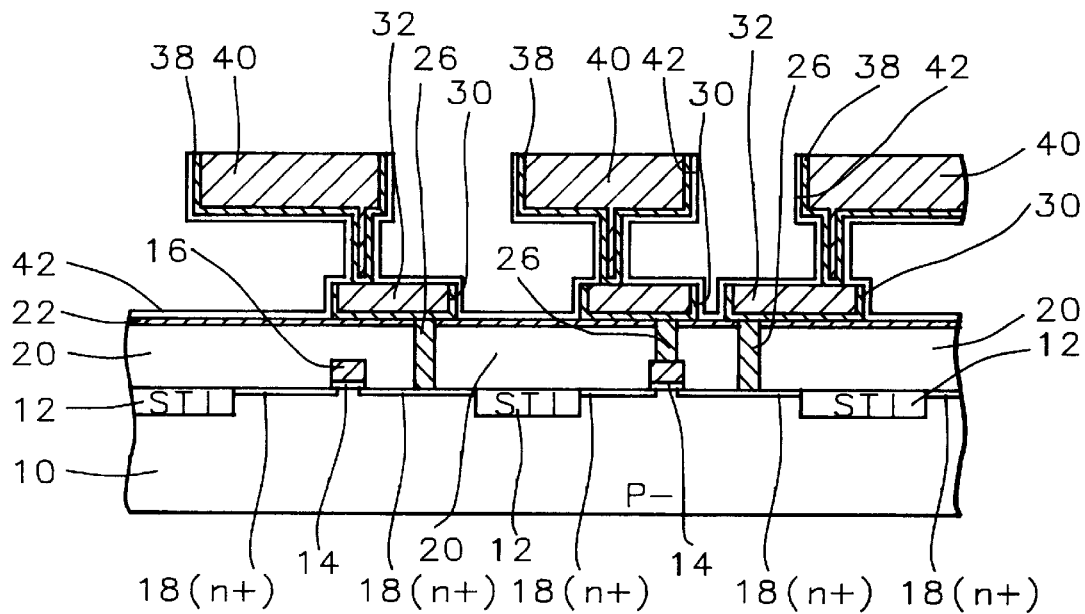

Referring now to FIG. 7, all remaining photoresists (layers 28, 34, and 36) are removed by plasma ashing in an oxygen ambient. This provides a free-standing metal interconnect structure consisting of the first and second level of metal interconnections, and addition metal levels that may be fabricated. A thin passivating layer 42, preferably aluminum oxide ($Al_2O_3$) is conformally deposited on the exposed surface of the first and subsequent levels of metal interconnections. The preferred thickness of layer 42 is between about 200 and 500 Angstroms. The conformal $Al_2O_3$ is preferably deposited by chemical vapor deposition (CVD). This provides a passivated metal interconnection having a thin $Al_2O_3$ and an air dielectric between the metal lines. After completing the air-insulated ICs, they can be die bonded and wire bonded in a ceramic package and sealed in an inert atmosphere. The bonding pads are solidly supported on the interlevel dielectric surface (layers 20, 22, and 42). Since the dielectric constant of the inert atmosphere (also air, vacuum, etc.) is about 1.0, the interlevel and intralevel capacitance is substantially reduced and the RC time constant is also significantly improved.

While the invention has been particularly shown and described with reference to the preferred embodiments thereof, it will be understood by those skilled in the art that various changes in form and details may be made without departing from the spirit and scope of the invention.

What is claimed is:

1. A method for fabricating air-insulated metal interconnections on a substrate comprising the steps of:

providing a substrate having device areas surrounded and electrically insulated from each other by field oxide regions, said device areas having partially completed devices formed from a patterned first polysilicon layer;

depositing a first insulating layer on said partially completed devices on said substrate;

planarizing said first insulating layer;

depositing a second insulating layer on said first insulating layer;

forming contact holes in said first and second insulating layers to said patterned first polysilicon layer and to said device areas on said substrate;

filling selectively said contact holes with a first conducting layer and thereby forming metal plugs;

depositing a first negative photoresist layer on said second insulating layer and on said metal plugs;

patterning said first negative photoresist layer and forming open regions extending over said metal plugs;

depositing a conformal second conducting layer on said first negative photoresist layer and in said open regions electrically contacting said metal plugs;

depositing a third conducting layer over said second conducting layer sufficiently thick to fill said open regions in said first negative photoresist layer;

planarizing said third conducting layer leaving portions of said third conducting layer in said openings while removing said third conducting layer over and to said first negative photoresist layer thereby forming planar first metal interconnections;

depositing a positive photoresist layer over said metal interconnections;

depositing a second negative photoresist layer on said positive photoresist layer;

patterning said second negative photoresist layer leaving open regions over areas of said positive photoresist where second metal interconnections are desired;

exposing and developing in said positive photoresist layer and forming via holes to said first metal interconnections;

depositing a conformal fourth conducting layer on said second negative photoresist layer and in said open regions in said second negative photoresist layer;

depositing a fifth conducting layer over said fourth conducting layer sufficiently thick to fill said open regions in said second negative photoresist layer;

planarizing said fifth conducting layer leaving portions of said fifth conducting layer in said openings while removing said fourth conducting layer over and to said second negative photoresist layer thereby forming said desired second metal interconnections;

removing completely all said photoresist layers;

depositing a passivating layer conformally on the surface of said exposed first and second metal interconnections thereby completing said air-insulated metal interconnections.

2. The method of claim 1, wherein said patterned first polysilicon layer is heavily $N_+$ doped and has a thickness of between about 2000 and 5000 Angstroms.

3. The method of claim 1, wherein said first insulating layer is a borophosphosilicate glass (BPSG) planarized by chemical/mechanical polishing.

4. The method of claim 3, wherein said first insulating layer has a thickness of between about 5000 and 15000 Angstroms after said chemical/mechanical polishing.

5. The method of claim 1, wherein said second insulating layer is silicon nitride having a thickness of between about 500 and 2000 Angstroms.

6. The method of claim 1, wherein said metal plugs are titanium nitride and tungsten.

7. The method of claim 1, wherein said first negative photoresist layer is between about 8000 and 10000 Angstroms.

8. The method of claim 1, wherein said second and fourth conducting layers are deposited at room temperature and are composed of a titanium layer having a thickness of between about 200 and 1000 Angstroms, and a titanium nitride layer having a thickness of between about 200 and 1000 Angstroms.

9. The method of claim 1, where said third conducting layer is copper deposited by electroless plating and has a thickness of between about 8000 and 12000 Angstroms.

10. The method of claim 1, wherein said third conducting layer is planarized by chemical/mechanical polishing.

11. The method of claim 1, wherein said positive photoresist layer has a thickness of between about 6000 and 8000 Angstroms.

12. The method of claim 1, wherein said second negative photoresist layer is between about 10000 and 12000 Angstroms thick.

13. The method of claim 1, wherein said fifth conducting layer is copper deposited by electroless plating to a thickness of between about 12000 and 15000 Angstroms.

14. The method of claim 1, wherein said photoresist layers are removed by plasma ashing in an oxygen ambient.

15. The method of claim 1, wherein said passivating layer is composed of aluminum oxide ($Al_2O_3$) having a thickness of between about 200 and 500 Angstroms.

16. A method for fabricating multilevel air-insulated metal interconnections on a substrate for integrated circuits comprising the steps of:

(a) providing a substrate having device areas surrounded and electrically insulated from each other by field oxide regions, said device areas having partially completed devices formed from a patterned first polysilicon layer;

(b) depositing a first insulating layer on said partially completed devices on said substrate;

(c) planarizing said first insulating layer;

(d) depositing a second insulating layer on said first insulating layer;

(e) forming contact holes in said first and second insulating layers to said patterned first polysilicon layer and to said device areas on said substrate;

(f) filling selectively said contact holes with a first conducting layer and thereby forming metal plugs;

(g) depositing a first negative photoresist layer on said second insulating layer and on said metal plugs;

(h) patterning said first negative photoresist layer and forming open regions extending over said metal plugs;

(i) depositing a conformal second conducting layer on said first negative photoresist layer and in said open regions electrically contacting said metal plugs;

(j) depositing a third conducting layer over said second conducting layer sufficiently thick to fill said open regions in said first negative photoresist layer;

(k) planarizing said third conducting layer leaving portions of said third conducting layer in said openings while removing said third conducting layer over and to said first negative photoresist layer thereby forming planar first metal interconnections;

(l) depositing a positive photoresist layer over said metal interconnections;

(m) depositing a second negative photoresist layer on said positive photoresist layer;

(n) patterning said second negative photoresist layer leaving open regions over areas of said positive photoresist where second metal interconnections are desired;

(o) exposing and developing in said positive photoresist layer and forming via holes to said first metal interconnections;

(p) depositing a conformal fourth conducting layer on said second negative photoresist layer and in said open regions in said second negative photoresist layer;

(q) depositing a fifth conducting layer over said fourth conducting layer sufficiently thick to fill said open regions in said second negative photoresist layer;

(r) planarizing said fifth conducting layer leaving portions of said fifth conducting layer in said openings while removing said fourth conducting layer over and to said second negative photoresist layer thereby forming said desired second metal interconnections;

(s) removing completely all said photoresist layers;

(t) depositing a passivating layer conformally on the surface of said exposed first and second metal interconnections thereby completing said air-insulated metal interconnections.

(u) repeating steps (l) through (t) for each additional level of metal interconnections required to wire up said integrated circuits.

17. The method of claim 16, wherein said patterned first polysilicon layer is heavily $N^+$ doped and has a thickness of between about 2000 and 5000 Angstroms.

18. The method of claim 16, wherein said first insulating layer is a borophosphosilicate glass (BPSG) planarized by chemical/mechanical polishing.

19. The method of claim 18, wherein said first insulating layer has a thickness of between about 5000 and 15000 Angstroms after said chemical/mechanical polishing.

20. The method of claim 16, wherein said second insulating layer is silicon nitride having a thickness of between about 500 and 2000 Angstroms.

21. The method of claim 16, wherein said metal plugs are titanium nitride and tungsten.

22. The method of claim 16, wherein said first negative photoresist layer is between about 8000 and 10000 Angstroms.

23. The method of claim 16, wherein said second and fourth conducting layers are deposited at room temperature and are composed of a titanium layer having a thickness of between about 200 and 1000 Angstroms, and a titanium nitride layer having a thickness of between about 200 and 1000 Angstroms.

24. The method of claim 16, where said third conducting layer is copper deposited by electroless plating and has a thickness of between about 8000 and 12000 Angstroms.

25. The method of claim 16, wherein said third conducting layer is planarized by chemical/mechanical polishing.

26. The method of claim 16, wherein said positive photoresist layer has a thickness of between about 6000 and 8000 Angstroms.

27. The method of claim 16, wherein said second negative photoresist layer is between about 10000 and 12000 Angstroms thick.

28. The method of claim 16, wherein said fifth conducting layer is copper deposited by electroless plating to a thickness of between about 12000 and 15000 Angstroms.

29. The method of claim 16, wherein said photoresist layers are removed by plasma ashing in an oxygen ambient.

30. The method of claim 16, wherein said passivating layer is composed of aluminum oxide ($Al_2O_3$) having a thickness of between about 200 and 500 Angstroms.

* * * * *